United States Patent [19]

Carter

[11] Patent Number: 4,713,557
[45] Date of Patent: Dec. 15, 1987

[54] BIDIRECTIONAL BUFFER AMPLIFIER

[75] Inventor: William S. Carter, Santa Clara, Calif.

[73] Assignee: Xilinx, Inc., San Jose, Calif.

[21] Appl. No.: 13,314

[22] Filed: Feb. 11, 1987

Related U.S. Application Data

[63] Continuation of Ser. No. 655,008, Sep. 26, 1984.

[51] Int. Cl.[4] .......................... H03K 17/56; H04B 3/38
[52] U.S. Cl. ..................................... 307/242; 307/279;
307/475; 328/103; 328/152
[58] Field of Search ............... 307/242, 475, 571, 279,
307/443; 328/103, 152; 340/346; 370/26

[56] References Cited

U.S. PATENT DOCUMENTS

| 3,983,543 | 9/1976 | Cordaro | 340/173 FR |
| 4,154,978 | 5/1979 | Tu | 370/31 |
| 4,446,382 | 5/1984 | Moore et al. | 307/241 |

FOREIGN PATENT DOCUMENTS

| 137616 | 1/1978 | Japan . |
| 141836 | 11/1980 | Japan . |
| 191535 | 11/1983 | Japan . |
| 335108 | 9/1930 | United Kingdom . |

OTHER PUBLICATIONS

"Ungated Common I/O Buffer for Card Testing", by Harrod et al., IBM Technical Disclosure Bulletin, vol. 21, No. 6, 11/78.

Primary Examiner—Stanley D. Miller
Assistant Examiner—Richard Rosen
Attorney, Agent, or Firm—Alan H. MacPherson; Paul J. Winters; Edel M. Young

[57] ABSTRACT

Bidirectional amplifier employs a single buffer amplifier (64). The bidirectional amplifier is programmed by applying a control signal (Q) and its complementary signal ($\overline{Q}$), which establishes the state of four pass transistors ($P_1'$, $P_2'$, $P_3'$, $P_4'$) or four CMOS transmission gates ($T_1$, $T_2$, $T_3$, $T_4$). For a first selection of the control signal, the bidirectional amplifier receives an input signal on a first lead (A') and produces an amplified signal on a second lead (B'). For a second selection of the control signal, the amplifier receives an input signal on the second lead (B') and produces an amplified output signal on the first lead (A').

2 Claims, 16 Drawing Figures

+ = ─┼─ (i.e., Crossover without Connection or Possibility of Connection)

+ = ─┼─ or ─┼─ (i.e., Can Only be Connected or Disconnected, As Input or Output, But Cannot be Broken)

▣ = Full Interchange – e.g. Figure 4B-7

✳ = Full Interchange – e.g. Figure 4B-3

⊹ = Partial Interchange: ─┘  ─┘  ─┘  ─┘  e.g. Fig. 4B-6

Lines(4 Vertical Shown) that do not have ▣ or ✳ Intersections are Intended to be Low Skew (i.e., Clock or Other) Paths.

▷ = Directional Amplifier (Direction is Selectable) to Prevent Signal Drooping Through too Many Pass Devices.

FIG. 3B

| LEAD A | PASS TRANSISTOR | LEAD B |
|---|---|---|
| 91-6 | 92-1 | 91-5 |
| 91-6 | 92-2 | 91-4 |
| 91-6 | 92-3 | 91-2 |
| 91-6 | 92-4 | 91-1 |
| 91-1 | 92-5 | 91-5 |
| 91-2 | 92-6 | 91-5 |
| 91-1 | 92-7 | 91-4 |
| 91-6 | 92-8 | 91-3 |
| 91-1 | 92-9 | 91-3 |
| 91-2 | 92-10 | 91-3 |
| 91-3 | 92-11 | 91-4 |
| 91-3 | 92-12 | 91-5 |
| 91-2 | 92-13 | 91-4 |

FIG. 9

BIDIRECTIONAL BUFFER AMPLIFIER

This application is a continuation of application Ser. No. 655,008, filed 09/26/84.

FIELD OF THE INVENTION

This invention relates to a bidirectional buffer amplifier, and in particular to a bidirectional buffer amplifier for use in a configurable logic array.

BACKGROUND OF THE INVENTION

FIG. 1 shows a bidirectional amplifier which includes amplifiers 1 and 2 and pass transistors $P_1$ and $P_2$. A pass transistor is a transistor whose function is to either transmit (i.e. "pass") or block a received signal as determined by the application of a control voltage to the gate of the pass transistor. A pass transistor may be either an N channel enhancement mode transistor or a P channel enhancement mode transistor. (Throughout this specification a pass transistor will be represented by the symbol used for $P_1$ in FIG. 1.) The bidirectional amplifier of FIG. 1 is described in copending U.S. patent application Ser. No. 588,478, which is incorporated herein by reference.

Assuming pass transistors $P_1$ and $P_2$ in FIG. 1 are N channel enhancement mode transistors, pass transistor $P_1$ is on and pass transistor $P_2$ is off when the control signal Q is high (logical 1) and control signal $\overline{Q}$ is low (logical 0). The signal on node B is then buffered by amplifier 1, whose output signal is passed by pass transistor $P_1$ to node A. On the other hand, when Q is low and $\overline{Q}$ is high, N channel pass transistor $P_1$ is off, N channel pass transistor $P_2$ is on, and the signal on node A is buffered by buffer amplifier 2, whose output signal is passed by pass transistor $P_2$ to node B.

The bidirectional amplifier shown in FIG. 1 has particular utility in a configurable logic array. The term configurable logic array is explained in the detailed description below. At this point it is sufficient to note that in routing signals through various interconnections between configurable logic elements in a configurable logic array, the signal may be weakened or degraded by passing through a large number of pass transistors or CMOS transmission gates. A CMOS transmission gate is illustrated in FIG. 7. An input signal on lead 10-1 passes through N channel transistor 10-4 and P channel transistor 10-5 to output lead 10-2 when a high voltage control signal is applied to control lead 10-3, which is connected to the gate of N channel transistor 10-4 and by means of inverter 10-6 to the gate of P channel transistor 10-5. Conversely, when a low control signal (0 volts) is applied to control lead 10-3, the input signal on lead 10-1 is blocked. Since a signal in a configurable logic array may pass through several CMOS transmission gates or pass transistors each of which attenuates the signal, it is often necessary to amplify or reconstruct the signal by means of a buffer amplifier. The amplifier employed is bidirectional since it is not known when the amplifier is installed in the configurable logic array which way the signal will flow, when the array is ultimately configured.

The bidirectional amplifier of FIG. 1 has the drawback that two buffer amplifiers are required for its implementation. In contrast, the bidirectional amplifier of the present invention uses a single amplifier, thus reducing the cost of implementing a bidirectional amplifier.

SUMMARY

A programmable bidirectional buffer amplifier is provided which employs a single buffer amplifier. The bidirectional amplifier is programmed by means of two signals Q and $\overline{Q}$, each of which controls the state of two pass transistors or two CMOS transmission gates. For a first selection of signals Q and $\overline{Q}$, the bidirectional amplifier receives an input signal on a first lead, and produces an amplified signal on a second lead. For a second selection of signals Q and $\overline{Q}$, the bidirectional amplifier receives an input signal on the second lead and produces an amplified signal on the first lead.

DESCRIPTION OF THE DRAWINGS

FIG. 3B shows the key to the cross-connections between crossing conductive leads in FIG. 3A;

FIGS. 4B-1 through 4B-7 form the key showing the types of interconnections made by the symbols shown in FIG. 4A;

FIG. 6 shows one embodiment of the bidirectional amplifier of my invention;

FIG. 7 shows a CMOS transmission gate;

FIG. 9 identifies the leads in FIG. 5b connected by each pass transistor in FIG. 5b.

DETAILED DESCRIPTION

Figure 6:
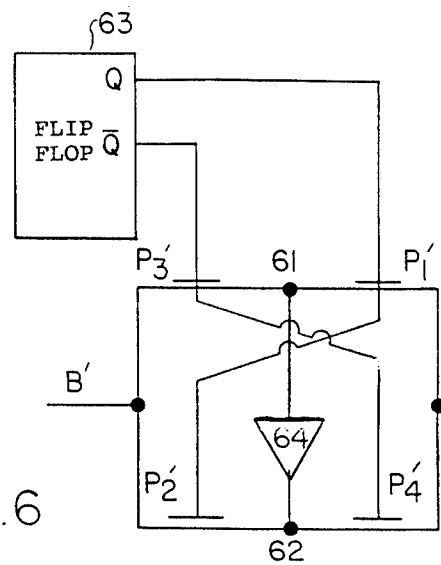

A preferred embodiment of the present invention is described in conjunction with FIG. 6 discussed infra.

One embodiment of the bidirectional amplifier of the present invention is explained in conjunction with its use in the configurable logic array disclosed in copending U.S. application No. 588,478 filed Mar. 12, 1984.

A configurable logic array as disclosed in U.S. patent application No. 588,478, is comprised of a multiplicity of configurable logic elements, each of which can include all the circuit elements necessary to provide one or more logical functions provided by, for example, an AND gate, flip flop, inverter, NOR gate, exclusive OR gate, and combinations of these functions to form more complex functions. The particular function to be carried out by a configurable logic element is determined by control signals applied to the configurable logic element from control logic. Depending on the control signals, the configurable logic element can function as an AND gate, an OR gate, a NOR gate, a NAND gate or an exclusive OR gate or any one of a number of other logic elements without any change in physical structure.

Figure 2:
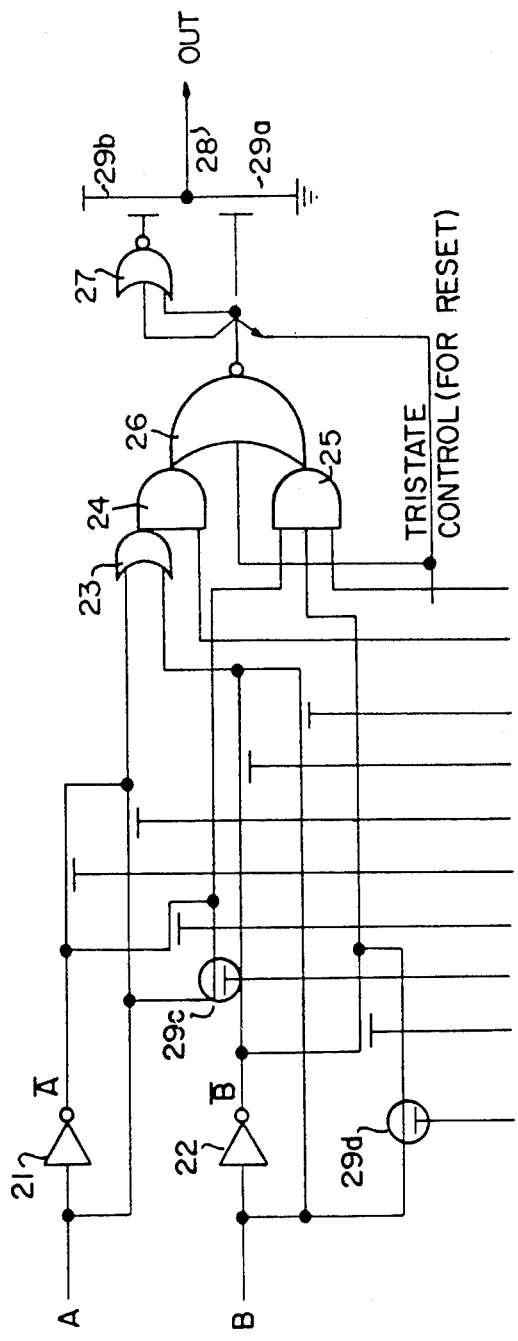
FIG. 2 illustrates the internal logic structure of one possible configurable logic element capable of implementing a number of useful functions of two variables A and B.

FIG. 2 illustrates the internal logic structure of one possible configurable logic element which is capable of implementing all useful basic functions of the two variables A and B, with the functions being selected by configuration control signals C0, $\overline{C0}$, C1, $\overline{C1}$, ... through C5 on control leads C0, $\overline{C0}$, ... through C5. In this example, each control lead is connected to the gate of an N channel enhancement mode pass transistor. To implement an AND gate function using the structure shown in FIG. 2, the input leads labeled A and B are shunted past inverters 21 and 22, respectively, to AND gate 25 by high level signals on the C1 and C0 configuration control leads which, being connected to the gates of N channel enhancement mode pass transistors 29c and 29d, cause pass transistors 29c and 29d to turn on.

Low level signals are applied to the configuration control leads $\overline{C0}$ and $\overline{C1}$, thus blocking the output signals of inverters 21 and 22 from AND gate 25. In addition, a high level signal on lead C5 is applied to enable AND gate 25. Thus three input AND gate 25 functions as a two-input AND gate with respect to the signals A and B. The output signal of AND gate 25 provides one input signal to NOR gate 26. A second input signal to NOR gate 26 is provided by the output signal of AND gate 24. The output signal of AND gate 24 is held at a logical 0 by applying a logical 0 to configuration control lead C4. Thus the control signals C2 and C3 are "don't cares", that is, these signals can be high or low without affecting the output signal of AND gate 24. Since the output signal of AND gate 24 is a logical 0 and since the tristate control input signal to NOR gate 26 is a logical 0, it is easy to see that AND gate 25, AND gate 24 and NOR gate 26 function together as a NAND gate with respect to input signals A and B. Since the tri-state control signal input to NOR gate 27 is a logical 0 (except during reset), NOR gate 27 serves as an inverter with respect to the output signal of NOR gate 26. The output signal of NOR gate 26 is applied to the gate of N channel transistor 29a (the source of which is grounded and the drain of which is connected to output lead 28) and the complement of the output signal of NOR gate 26 is applied to the gate of N channel transistor 29b (the source of which is connected to a power supply and the drain of which is connected to both the output lead 28 and the drain of N channel transistor 29a). Thus, transistors 29a and 29b function as an inverter with respect to the output signal of NOR gate 26. Thus, the structure of FIG. 2 configured as described above performs the function of an AND gate with respect to the signals A and B.

Other logic functions can also be produced by appropriate selection of the control signals to be supplied to the configuration control leads C0 through C5 to activate the appropriate pass transistors and gates within the structure. Many other embodiments of a configurable logic element are, of course, possible.

Figure 3A:
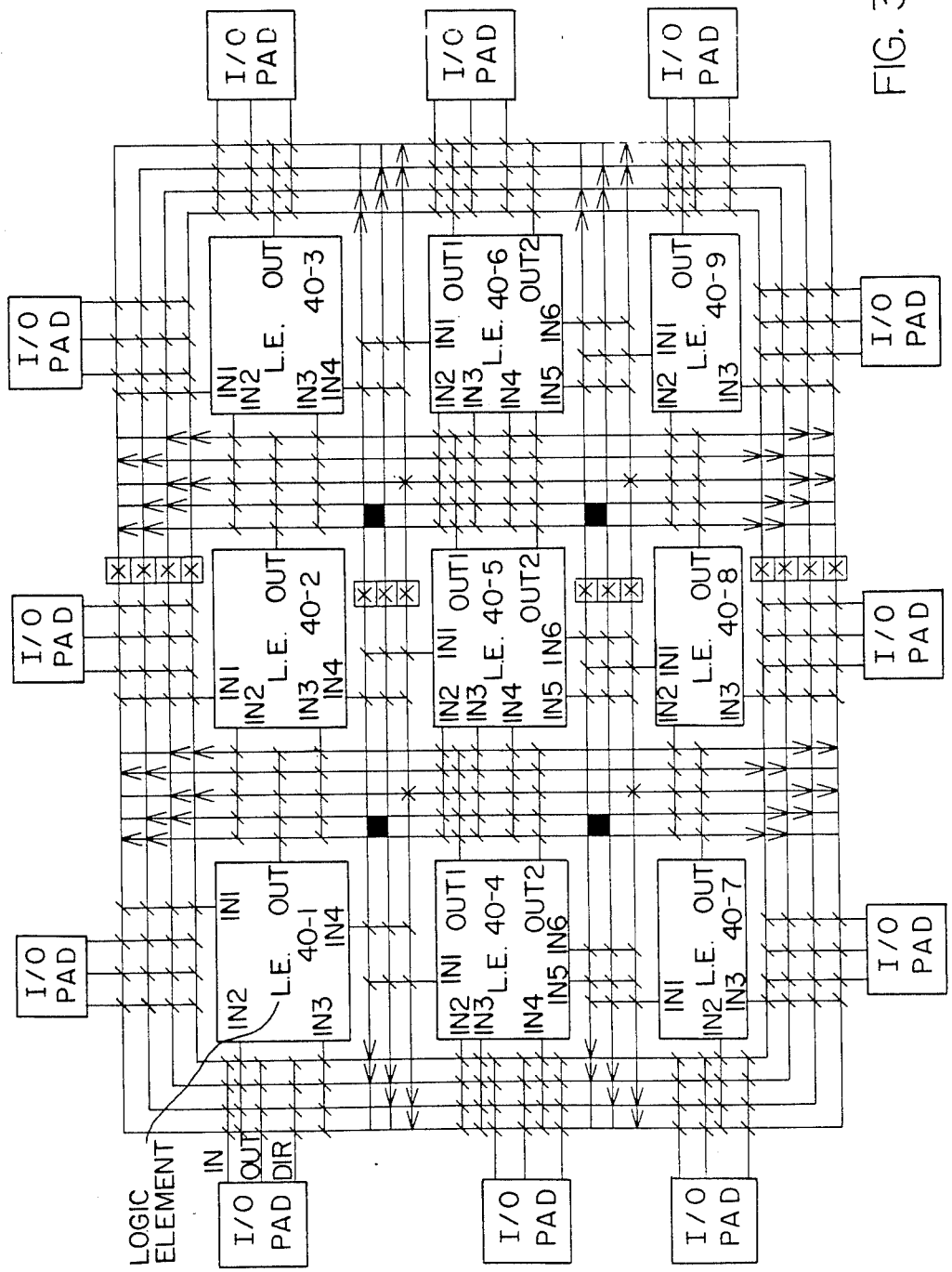
FIG. 3A illustrates a configurable logic array wherein a plurality of configurable logic elements (shown as nine logic elements) are formed on an integrated circuit chip together with programmable interconnects formed between selected leads to yield desired logic functions and with selected input/output pads and interconnections of the leads between logic elements.

FIG. 3A illustrates an embodiment of a configurable logic array as disclosed in the copending application No. 588,478 containing nine configurable logical elements. Each of the logical elements as shown in FIG. 3A is placed on an integrated circuit chip together with interconnects and configurable switches for connecting various leads to other leads. Each of logic elements 40-1 through 40-9 represents a collection of circuitry such as that shown in FIG. 2 or some similar structure capable of being configured as described above to perform any one of a number of logic functions. To program the circuitry (both the configurable interconnect switches and the configurable logic elements), selected signals are applied to input leads identified as configuration control input leads thereby to generate a desired logical function in each of the logic elements and to interconnect the logic elements as desired. In FIG. 3A, no specific lead has been identified as an input lead for the configuration control signals. However, any particular I/O pad can be selected for this purpose. The configuration control signals can be input into the configurable logic array either in series or in parallel depending upon design considerations where they are typically stored in a programming register (not shown). In addition, another I/O pad will be used to input clock signals which are used, inter alia, for the loading of the configuration control signals into the programming register. When the configurable logic array shown in FIG. 3A has been configured, selected output signals of logic elements 40-1 through 40-9 are provided to selected I/O pads. FIG. 3B illustrates the meaning of the interconnect symbols used in FIG. 3A.

To configure a logic element such as logic element 40-1 (FIG. 3A, 3B) a number of bits must be applied to the configuration control leads such as leads C0 through C5, as shown, for example, in FIG. 2.

Figure 4A:
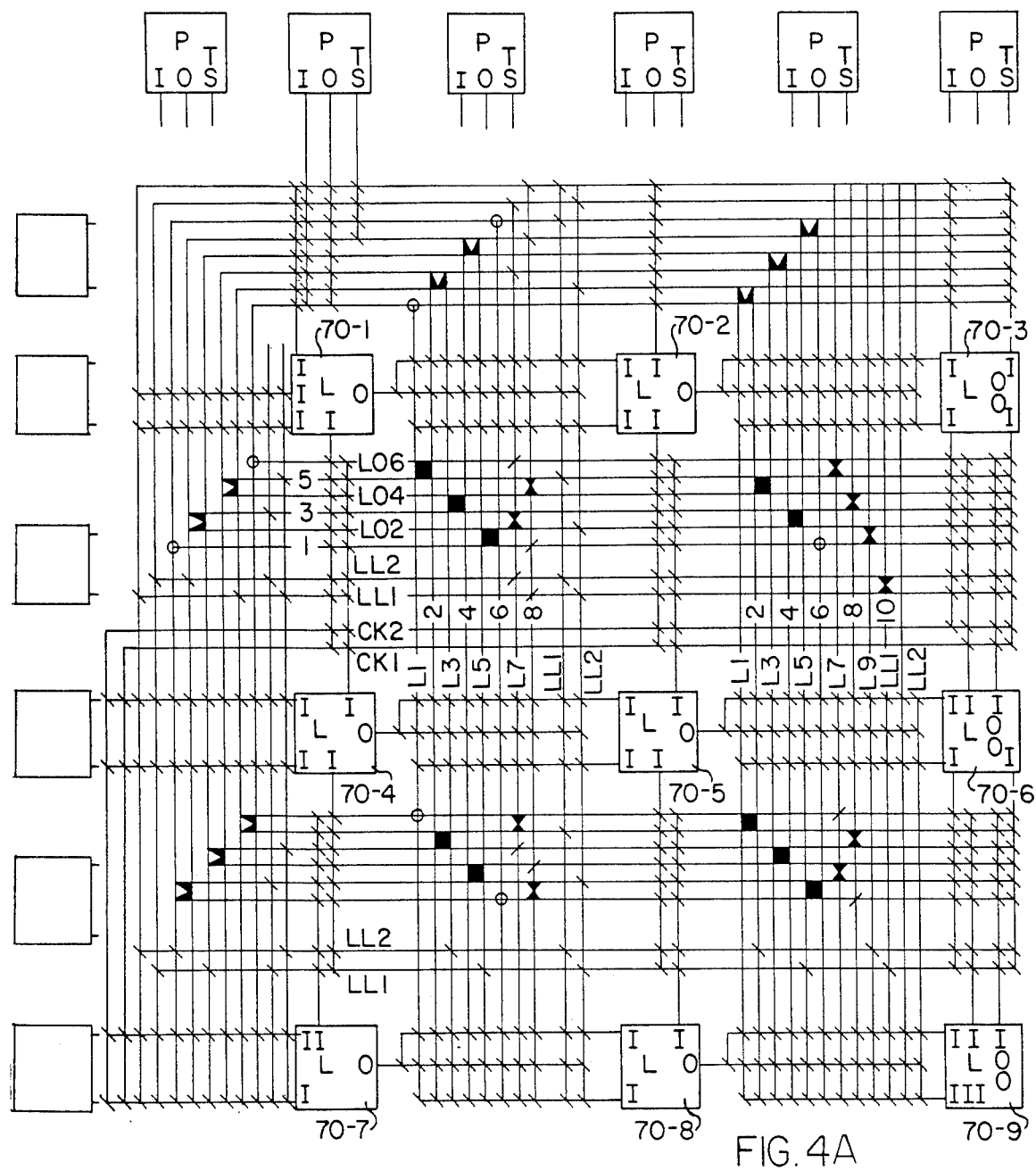
FIG. 4A represents a schematic diagram of a configurable logic array showing nine of N configurable logic elements where N is a selected integer greater than nine and showing selected interconnections between conductive leads.

FIG. 4A shows an additional configurable logic array containing a plurality of configurable logic elements. In particular, configurable logic elements 70-1, 70-2, 70-4 and 70-5 are shown in their entirety while configurable logic elements 70-3, 70-6 and 70-7 through 70-9 are shown partially. In particular, the complete interconnections of these last five logical elements are not shown. The structure shown in FIG. 4A is merely illustrative of the types of configurations and connections which can be implemented using the configurable logic array of this invention and does not depict an actual circuit configured to carry out an intended function.

Figure 4B:
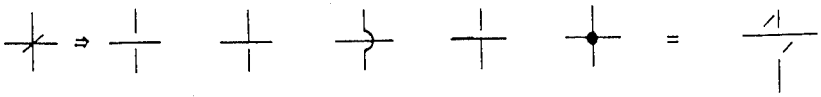
Figure 4B:
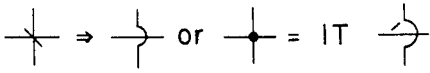
Figure 4B:
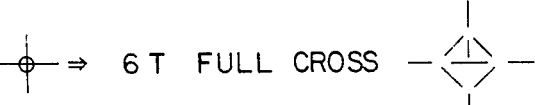
Figure 4B:
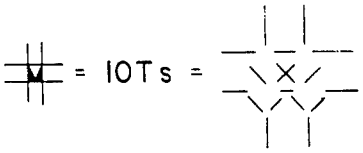
Figure 4B:
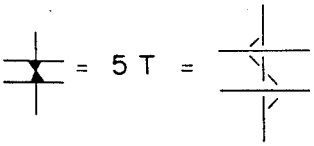
Figure 4B:
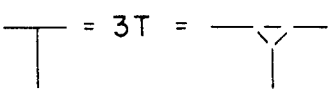

As shown in FIG. 4A, given leads can be interconnected by any one of a plurality of different means (i.e., interconnection structures). The symbols representing the interconnections shown in FIG. 4A are illustrated in FIG. 4B. In particular, while the schematics depicting various interconnections are to some extent self-explanatory, the conventions used in FIGS. 4B-1 through 4B-7 are further explained in FIGS. 5A through 5G.

Figure 5B:
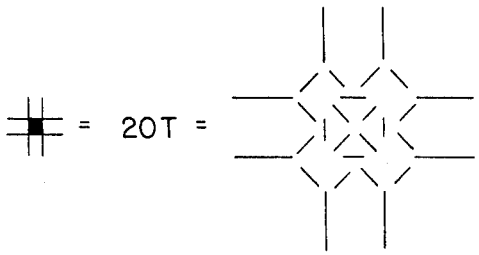
FIGS. 5A through 5G illustrate various topologies for forming interconnections between two or more leads of a configurable logic array.
Figure 5B:
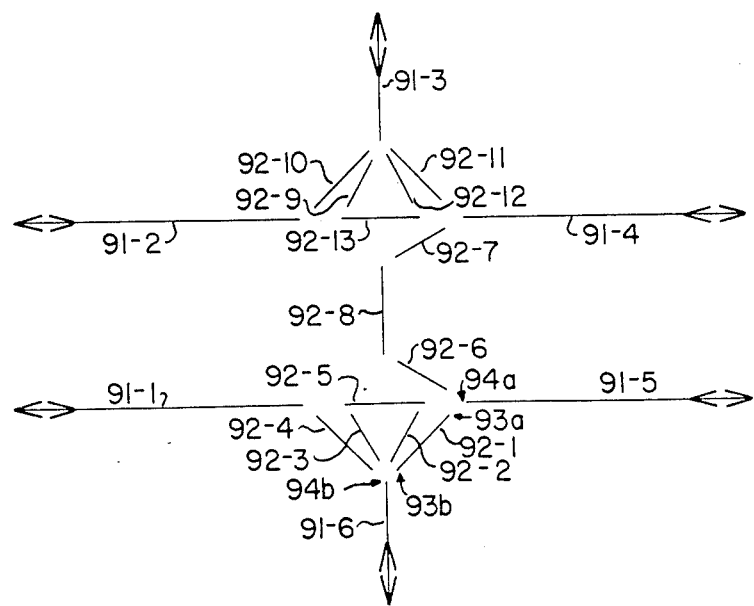
Figure 5A:
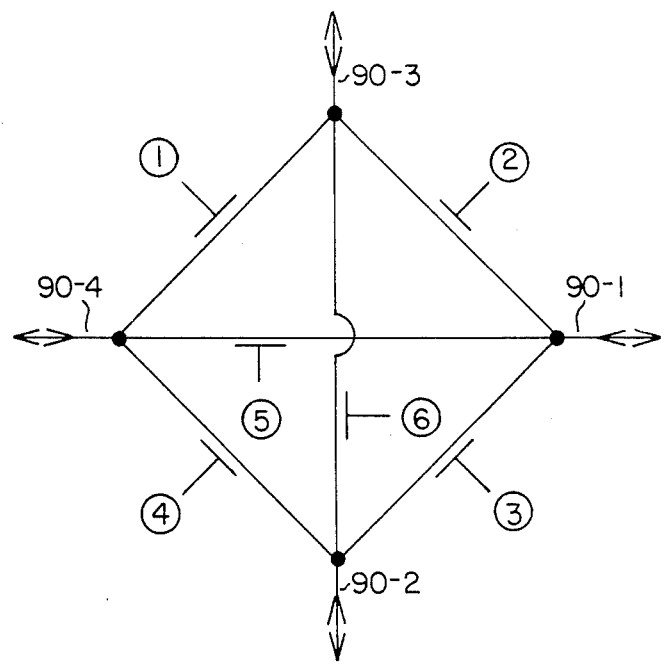

FIG. 5A is the schematic of a circuit for making a number of different interconnections between four leads coming together at a junction point: horizontal leads 90-1 and 90-4, and two vertical leads 90-2 and 90-3. Thus, transistor 2, when activated into the conducting state, connects lead 90-3 to lead 90-1. Pass transistor 1, when conducting, connects lead 90-3 to lead 90-4. Pass transistor 4, when conducting, connects lead 90-4 to lead 90-2 and pass transistor 3, when conducting, connects lead 90-1 to lead 90-2. Pass transistors 5 and 6, when off, separate leads 90-1 from lead 90-4 and separate lead 90-2 from lead 90-3, respectively. Thus, should it be desired to connect vertical lead 90-2 to vertical lead 90-3, pass transistor 6 is activated. Likewise, should it be desired to connect horizontal lead 90-1 to horizontal lead 90-4, pass transistor 5 is activated. The terminology used to represent the possible connections between a plurality of leads can become quite complex. Thus, a simplified notation system as shown in FIGS. 5B to 5D has been adopted.

In FIG. 5B, a plurality of pass transistors 92-1 through 92-13 are shown. The convention adopted in FIG. 5B is to have a given pass transistor represented by a single short line. Thus, the line labelled 92-1 represents a pass transistor. Pass transitor 92-1 is drawn so that its two ends point to the ends of the leads 91-5 and 91-6 being interconnected by pass transistor 92-1. Similarly, the right end 93a of pass transistor 92-1 is aimed to the end 94a of lead 91-5. The left end 93b of pass transistor 92-1 is aimed to the end 94b of lead 91-6. For simplicity and to avoid cluttering the drawing in FIG. 5B, the other ends of the transistors are not labelled. However, by visually aligning the line representing a given pass transistor with the ends of the leads 91-1 through 91-6 the particular two leads interconnected by that pass transistor can be determined. Thus, pass transistor 92-7 interconnects horizontal lead 91-4 with horizontal lead 91-1. Pass transistor 92-13 interconnects horizontal lead 91-4 with horizontal lead 91-2. Pass transistor 92-12 interconnects lead 91-3 with lead 91-5. Similar connections can be made between the other pass transistors and the other leads. The table in FIG. 9 lists the pass transistor connecting lead A with lead B in FIG. 5b.

The above description assumes that only two leads are to be interconnected. If more than two leads are to be interconnected, the structure of FIG. 5B can also be used for this purpose. Thus, lead 91-3 can be connected to lead 91-2 by turning on pass transistor 92-10. Simultaneously, lead 91-3 can be connected to lead 91-4 by turning on pass transistor 92-13. Alternatively, lead 91-3 could be connected to lead 91-4 by turning on pass transistor 92-11. Of course, this would also connect lead 91-4 through lead 91-3 and pass transistor 92-10 to lead 91-2. In addition, lead 91-6, for example, could be connected to the three leads 91-2, 91-3, 91-4 by turning on pass transistor 92-8. The number of interconnections which can be made using this structure is limited only by the imagination of the designer. In the limit, if all the pass transistors are turned on, all the leads 91-1 to 91-6 are interconnected. The resulting structure has a large capacitance which can actually be used in circuits as a component. Of course, all leads in FIG. 5B can be interconnected by turning on as few as five leads. Note that in FIG. 5B leads 91-1 and 91-2 cannot be directly connected to each other nor can lead 91-4 be directly connected to lead 91-5 without involving another lead. However, this omission is not of importance because in an integrated circuit there is in general no need for two horizontal leads to carry the same signal. Of course, two additional pass transistors could be added to the structure of FIG. 5B if FIG. 5B is considered to be merely a symbolic representation of intersecting leads and leads 91-1 and 91-2 are merely shown for convenience as being parallel but in fact represent nonparallel leads on an integrated circuit.

Figure 5C:
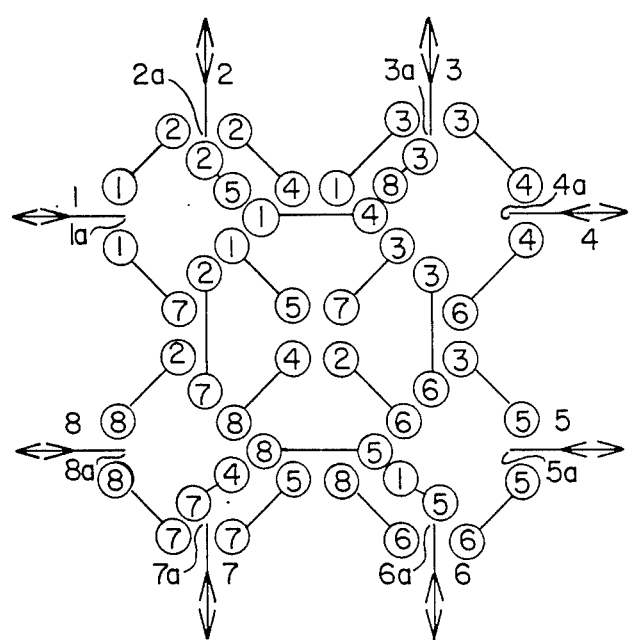
Figure 5D:
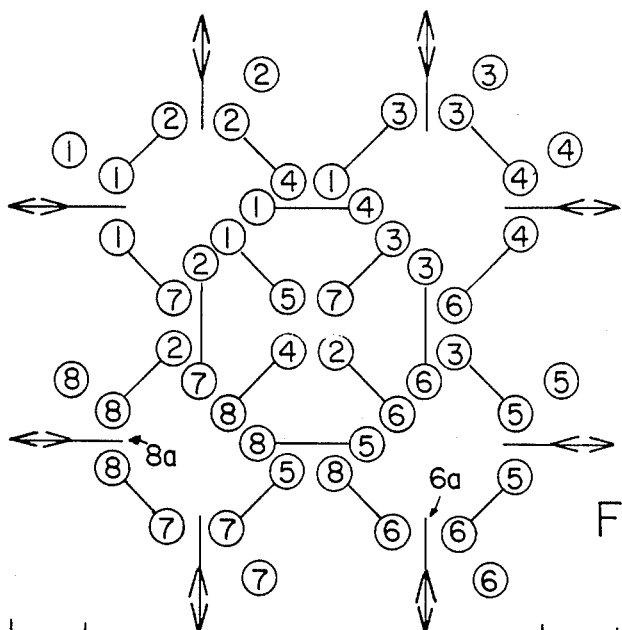

Turning to FIG. 5C another possible interconnection topology is illustrated. In FIG. 5C leads 1 to 8 are shown coming together at a complicated intersection. Leads 1 and 8 are parallel horizontal to the left, leads 4 and 5 are parallel horizontal to the right, leads 2 and 3 are parallel vertical up and leads 6 and 7 are parallel vertical down. Looking for a moment at lead 6, the end 6a of lead 6 can be connected sensibly to the ends "a" of leads 1, 2, 3, 4, 5 and 8. It is not sensible to connect lead 6 to lead 7 because theoretically the two leads are going in one direction and only one lead is required to carry the necessary information in that direction. Since lead 6 has six desirable possible connections and each of the other seven leads also has six desirable possible connections, there are a total of forty-eight desirable possible connections between the eight leads of FIG. 5C. Since a given pass transistor connects two ends, twenty-four pass transistors are required to make the desired forty-eight connections. Each pass transistor has its ends labelled in FIG. 5C to illustrate the leads which are connected by a given pass transistor. Thus, pass transistor 6-8 interconnects the end 6a of lead 6 to the end 8a of lead 8. Pass transistor 7-5 interconnects the end 7a of lead 7 to the end 5a of lead 5. Because of the complexity of the structure of FIG. 5C, a slightly different convention (a line with numbers on both ends) has been adopted for representing the pass transistor than was described above in conjunction with FIG. 5B.

FIG. 5D illustrates a configuration similar to that of FIG. 5C with only twenty interconnection transistors rather than the twenty-four transistors shown in FIG. 5C. As shown in FIG. 5D pass transistors 1-5, 7-4, 2-5 and 8-3 have been deleted from the transistors shown in FIG. 5C.

Figure 5E:
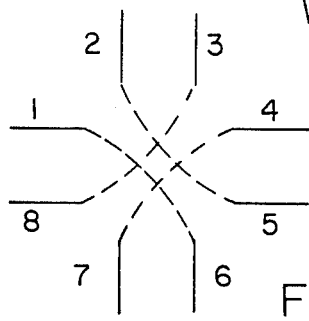
Figure 5F:
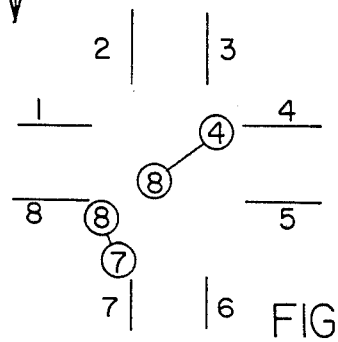

FIG. 5E illustrates the direct connections that would be possible if the four pass transistors omitted from FIG. 5C were in fact included. (A connection between lead A and lead B is direct if A and B are connected by a single pass transistor.) The dashed lines show the direct interconnections possible by these omitted transistors. FIG. 5D shows only twenty pass transistors whereas twenty-four pass transistors are necessary to make all possible direct connections. FIG. 5F illustrates, however, the way in which it is possible to interconnect leads 4 and 7 without the four transistor connections shown in FIG. 5E being present. Thus, to connect lead 4 to lead 7, lead 4 is connected directly to lead 8 by means of transistor 4-8 while lead 8 is connected directly to lead 7 by pass transistor 8-7.

Note that each of the interconnections shown above in FIGS. 5A through 5E requires only one pass transistor in order to connect one lead to another while for the particular configuration illustrated in FIG. 5F two pass transistors are required.

Figure 5G:
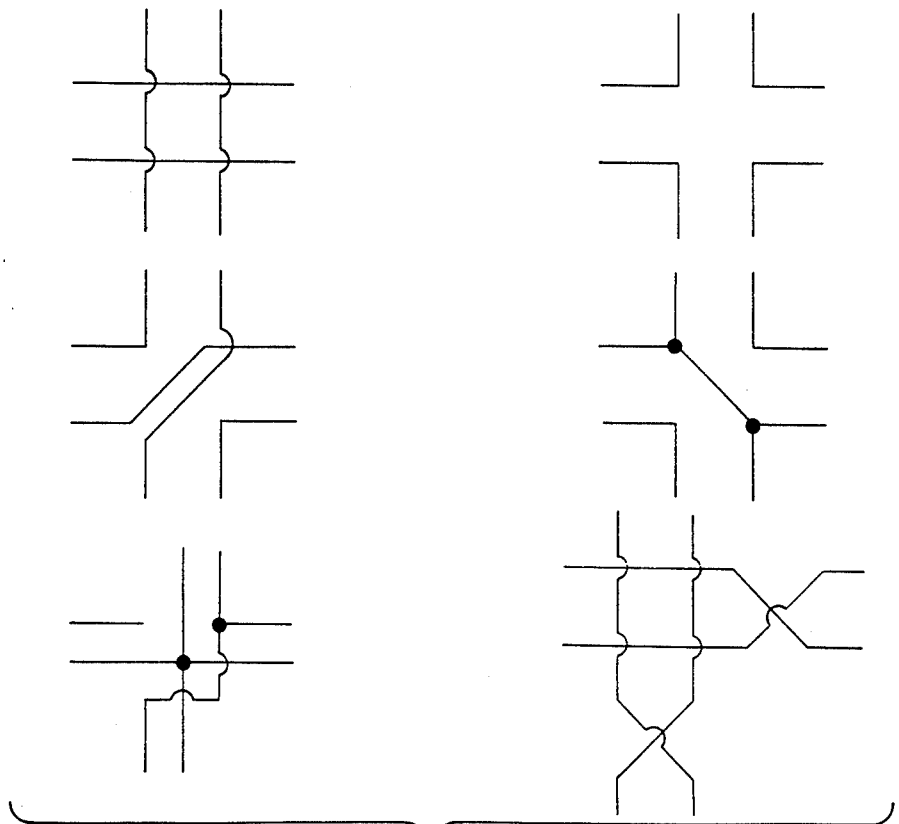

FIG. 5G illustrates types of possible interconnections. The leads interconnected are illustrated by showing continuous straight line segments meeting. These interconnections are self-explanatory.

The symbology used in FIGS. 4B-1 through 4B-7 is identical to the symbology just explained in conjunction with FIGS. 5A through 5G. Thus, for example, FIG. 4B-7 illustrates a solid block involving a twenty transistor interchange. The twenty transistor interchange shown in FIG. 4B-7 corresponds precisely to the interchange explained in more detail above in conjunction with FIG. 5D.

Figure 1:
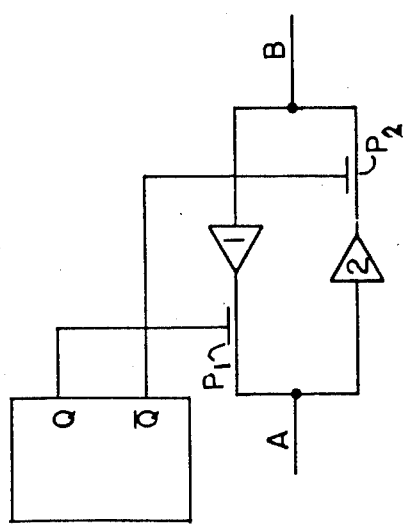
FIG. 1 shows a bidirectional amplifier described in copending U.S. patent application No. 588,478.

FIG. 4B-1 illustrates three transistors capable of making a T connection or a cross-connection but not a full interconnection. By full interconnection is meant the ability to connect each of the leads (in FIG. 4B-1, four leads) coming into a node to a given node or to each of the other leads coming into the node in any combination.

FIG. 4B-2 shows a one transistor interconnection to connect a row with a column. FIG. 4B-3 shows a six transistor full cross interconnection wherein any one of four leads coming into a node can be connected to any one of the other three leads. FIG. 4B-4 shows six leads coming into an intersection wherein ten pass transistors are used to interconnect any one of the six input leads to any one of five other leads input to the node. FIG. 4B-5 illustrates a four-lead node where two horizontal continuous leads are interconnected with two separate vertical leads using five pass transistors.

FIG. 4B-6 illustrates a three-transistor interconnection wherein any one of three leads coming into a node can be interconnected with any one of the other two leads. FIG. 4B-7 illustrates the twenty-transistor interchange for interconnecting any one of eight input leads to any one of the other eight input leads except that lead parallel and adjacent to the lead being interconnected as illustrated in FIG. 5D and except for the four interconnections shown in FIG. 5E (which also cannot be directly made using the structure of FIG. 4B-7).

Figure 7:
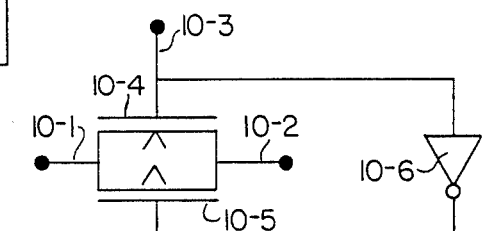

A CMOS transmission gate (as shown in FIG. 7) may be used in place of a pass transistor in implementing the interconnections described above.

As explained above and as shown schematically in FIG. 3A, signals reaching a bidirectional amplifier may pass through a large number of pass transistors or CMOS transmission gates at several interchanges between configurable logic elements. This tends to weaken or degrade the signals.

In FIG. 3A bidirectional amplifiers (shown by an X in a box) are used to amplify signals which have been attenuated by a number of pass transistors or CMOS transmission gates. This speeds up considerably the operation of the circuit. For example, for an unamplified signal the switching delay of the signal increases approximately in proportion to the square of the number of pass transistors through which the signal has passed. The amplifier speeds the propagation of the signal since the amplified signal reduces signal switching delay. This amplifier also reduces the load on the original signal source.

FIG. 6 shows one embodiment of the bidirectional amplifier of my invention. The pass transistors (gates) $P'_1$ and $P'_2$ are programmed in response to the control signal Q from storage element 63 which in one embodiment comprises a standard flip flop. Control signal Q is applied to the gates of pass transistors $P'_1$ and $P'_2$. Similarly, pass transistor $P'_3$ and $P'_4$ are programmed in response to the signal $\overline{Q}$ from storage element 63. Buffer amplifier 64 is connected between nodes 61 and 62. Node 61 is connected to node B' via pass transistor $P'_3$ and node 61 is connected to node A' via pass transistor $P'_1$. Similarly, node 62 is connected to node B' via pass transistor $P'_2$ and to node A' via pass transistor $P'_4$.

In one embodiment, where all of the pass transistors are N channel enhancement mode devices having a gate, a source, and a drain, when control signal Q is a logical 1 and control signal $\overline{Q}$ is a logical 0, pass transistors $P'_1$ and $P'_2$ are on, pass transistors $P'_3$ and $P'_1$ are off and a signal passes from node A' via pass transistor $P'_1$ to node 61, through amplifier 64 to node 62 and then to node B' via pass transistor $P'_2$. Conversely, when control signal Q is a logical 0 and control signal $\overline{Q}$ is a logical 1, pass transistors $P'_1$ and $P'_2$ are off, pass transistors $P'_3$ and $P'_4$, are on and a signal passes from node B' via pass transistor $P'_3$, to node 61, through amplifier 64 to node 62, and then to node A' via pass transistor $P'_4$. P channel pass transistors are used in other embodiments in which case the control signals applied to the gates of the P channel pass transistors are appropriately selected to achieve the desired result.

In another embodiment (not shown) each of the pass transistors is replaced by a corresponding CMOS transmission gate shown in FIG. 7. In FIG. 7, a control signal is applied to the gate of transistor 10-4 and its complementary signal is applied to the gate of transistor 10-5 via inverter 10-6, thus determining whether a signal may pass between leads 10-1 and 10-2.

Figure 8:
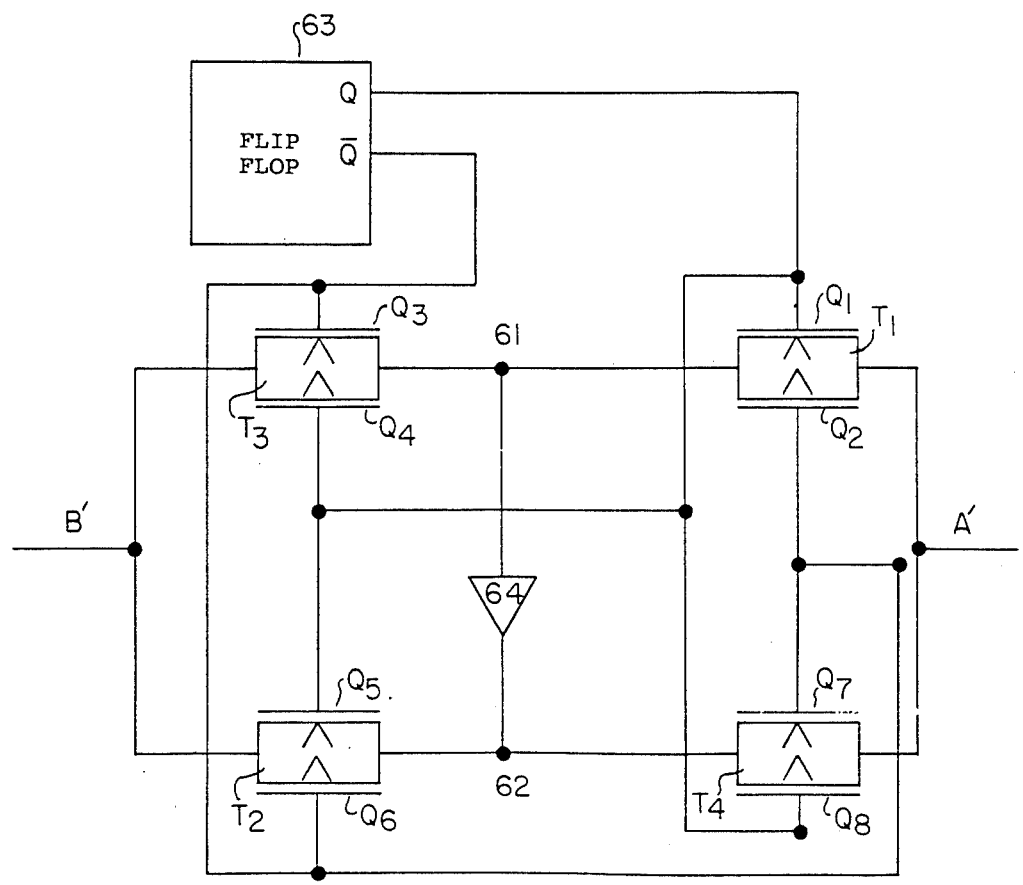
FIG. 8 shows an embodiment of the invention using CMOS transmission gates.

FIG. 8 shows another embodiment of the invention in which the control signal Q from storage element 63 is routed directly to the control gates of transistors $Q_1$, $Q_4$, $Q_5$, and $Q_8$ of CMOS transmission gates $T_1$, $T_3$, $T_2$, and $T_4$ respectively and the control signal $\overline{Q}$ (the complement of Q) is routed directly to the control gate of transistors $Q_3$, $Q_6$, $Q_2$, and $Q_7$ of transmission gates $T_3$, $T_2$, $T_1$ and $T_4$ respectively. This embodiment eliminates the need for the inverter 10-6 shown in FIG. 7.

The above description is meant to be exemplary and not limiting and, in view of the above disclosure, many substitutions or modifications will be obvious to one of ordinary skill in the art without departing from the spirit and scope of the invention.

I claim:

1. A bidirectional amplifier comprising:
   an amplifier having an input lead and an output lead;
   first transistor means responsive to the application of a control voltage for controllably conducting a first input signal from a first terminal to said input lead;
   second transistor means responsive to the application of a control voltage for controllably conducting a second input signal from a second terminal to said input lead;
   third transistor means responsive to the application of a control voltage for controllably conducting an output signal of said amplifier from said output lead to said first terminal;
   fourth transistor means responsive to the application of a control voltage for controllably conducting said output signal of said amplifier from said output lead to said second terminal; and
   means for selectively programming said first, second, third and fourth transistor means by using control voltages such that for a first program selection said first transistor means and said fourth transistor means conduct said first input signal and said output signal, respectively, and said second transistor means and said third transistor means block said second input signal and said output signal, respectively, and for a second program selection said second transistor means and said third transistor means conduct said second input signal and said output signal, respectively, and said first transistor means and said fourth transistor means block said first input signal and said output signals, respectively; and
   said means for selectively programming having a first lead connected to said first transistor means and said fourth transistor means, and having a second lead connected to said second transistor means and said third transistor means, so that said means for selectively programming generates said control voltages for controllably conducting said input and output signals independent of the state of said input signals.

2. A bidirectional amplifier comprising:
   an amplifier having an input lead and an output lead wherein an input signal on said input lead generates an output signal from said amplifier on said output lead;
   a first terminal;
   a second terminal;

first transistor means for selectively passing a first input signal on said first terminal to said input lead or passing said output signal on said output lead to said first terminal;

second transistor means for selectively passing a second input signal on said second terminal to said input lead or passing said output signal on said output lead to said second terminal; and control voltage generating means for controlling said first transistor means and said second transistor means so that in response to a first signal from said control voltage generating means said first input terminal, and in response to a second signal from said control voltage generating means said second input signal on said second terminal is passed to said first terminal, said first signal and said second signal each being generated by said control voltage generating means independent of said input signal on said input lead.

* * * * *

UNITED STATES PATENT AND TRADEMARK OFFICE
CERTIFICATE OF CORRECTION

PATENT NO. : 4,713,557

DATED : December 15, 1987

INVENTOR(S) : Carter, William S.

It is certified that error appears in the above-identified patent and that said Letters Patent is hereby corrected as shown below:

Col. 7, line 52, "$P'_3$ and $P'_1$" should read --$P'_3$ and $P'_4$--.

Claim 2, col. 10, line 2, after "input" insert:
--signal on said first terminal is passed to said second--.

Signed and Sealed this

Twenty-fifth Day of October, 1988

Attest:

DONALD J. QUIGG

Attesting Officer

Commissioner of Patents and Trademarks